United States Patent [19]
Eikill et al.

[11] Patent Number: 5,193,165
[45] Date of Patent: Mar. 9, 1993

[54] MEMORY CARD REFRESH BUFFER

[75] Inventors: Richard G. Eikill; Charles P. Geer, both of Rochester, Minn.

[73] Assignee: International Business Machines Corporation, Armonk, N.Y.

[21] Appl. No.: 450,139

[22] Filed: Dec. 13, 1989

[51] Int. Cl.$^5$ .................... G06F 13/00; G11C 13/00
[52] U.S. Cl. .................... 395/425; 364/246.91; 364/964.9; 364/DIG. 2
[58] Field of Search .......... 365/222; 364/DIG. 1, 364/DIG. 2; 395/425

[56] References Cited
U.S. PATENT DOCUMENTS

| | | | |
|---|---|---|---|
| 3,800,295 | 3/1974 | Anderson | 365/222 |
| 4,106,108 | 8/1978 | Cislaghi et al. | 365/222 |
| 4,172,282 | 10/1979 | Aichelmann, Jr. et al. | 365/222 X |
| 4,625,296 | 11/1986 | Shriver | 365/222 X |
| 4,625,301 | 11/1986 | Berger | 365/222 |
| 4,697,303 | 9/1987 | Churchward et al. | 365/222 |
| 4,747,082 | 5/1988 | Minato et al. | 365/222 |

FOREIGN PATENT DOCUMENTS

0338528 10/1989 European Pat. Off. .
63-140491 6/1988 Japan .

OTHER PUBLICATIONS

*IBM Technical Disclosure Bulletin,* "Minimal Interference Refresh", vol. 30, No. 10, Mar. 1988, pp. 201-203.
A. R. Basilico and R. M. Dinkjian, *IBM Technical Disclosure Bulletin,* vol. 25, No. 7A, Dec. 1982, p. 3182.
C. J. Gerardin and J. P. Levis, *IBM Technical Disclosure Bulletin,* vol. 16, No. 3, Aug. 1973, pp. 934-936.
J. A. Buettner, T. L. Crooks, L. J. Johnson and L. F. Saunders, *IBM Technical Disclosure Bulletin,* vol. 23, No. 4, Sep. 1980, pp. 1592-1602.

*Primary Examiner*—David Y. Eng
*Attorney, Agent, or Firm*—Frederick W. Niebuhr; J. Michael Anglin

[57] ABSTRACT

A data processing network includes multiple processing devices, one or more memory cards in main storage, and a shared interface for processor access to main storage. Each of the memory cards includes dynamic random access memory arrays which require a periodic refresh pulse. To provide refresh pulses, each of the memory cards includes a programmable register, a counter receiving clock pulses, and a comparator. The comparator generates a request pulse each time the output from the pulse counter equals a selected value provided by the register. The register is programmable to controllably adjust the selected value, and thus select the frequency at which refresh request pulses are generated by the comparator. The memory card further includes a buffer for receiving the refresh request pulses and generating a refresh request responsive to each pulse. Responsive to the refresh request, a memory array control circuit either provides a refresh signal to the arrays, or stores the refresh request, depending on whether the arrays are busy with an external request. However, when stored requests accumulate to a predetermined threshold, the external request is interrupted and a refresh signal is provided to the arrays.

14 Claims, 1 Drawing Sheet

MEMORY CARD REFRESH BUFFER

BACKGROUND OF THE INVENTION

The present invention relates to information processing systems including processing devices coupled to a main storage memory with dynamic data arrays, and more particularly to means for providing periodic refresh cycles to memory arrays on multiple memory cards comprising main storage.

Dynamic memories are used frequently in data processing systems, as they offer high data storage density at low cost, relative to static memories. Usually, such memories comprise arrays (rows and columns) of individual bit locations or cells. Each cell has a capacitance, and discharges over time, thus giving rise to the need to periodically restore the charge or "refresh" the cell.

The refresh operation involves gaining access individually to each row of a memory array. Arrays typically have multiple rows, e.g. 512 or 1,024 rows. Assuming, for example, that particular arrays must be refreshed every 4 milliseconds and include 512 rows, the refresh cycle, i.e. the time between successive refresh requests, is equal to the refresh interval divided by the number of rows, in this case 0.004 seconds divided by 512 rows or about 7.8 microseconds. The overhead involved in generating and sending these requests substantially reduces memory availability, by up to twenty percent in some cases. This of course diminishes the value of the memory, in terms of its ability to service external requests from processing devices for fetching and storing data.

Attempts to deal with this problem include dividing semiconductor memory into two blocks, for example as disclosed in U.S. Pat. No. 4,106,108 (Cislaghi et al). If a central processor assigns a read/write operation to one of the blocks for a particular cycle, the same cycle is used to refresh a row of memory elements in the other block. A memory divided into two parts also is disclosed in IBM Technical Disclosure Bulletin, Volume 16, No. 3 (August 1973).

Another approach is to delay a memory refresh pulse to service external requests. U.S. Pat. No. 4,691,303 (Churchward et al) discloses a refresh system for multiple banks of semiconductor memory, with logic that prevent refresh pulses from interfering with read/write operations during an initial countdown from a selected value to zero. In U.S. Pat. No. 4,625,301 (Berger), a central processor controlled refresh circuit provides refresh requests that increment a counter, with each refresh operation decrementing the counter. A refresh is forced if the counter reaches a critical limit. IBM Technical Disclosure Bulletin, Volume 25, No. 7A (December 1982) relates to four-bit refresh counter that inhibits the refresh function from count 0000-0111, permits refresh if the memory is not busy from count 1000-1110, and demands a refresh function at count 1111. Each memory cycle time increments the counter, which is reset to zero with each refresh operation.

Other improvements include providing means to select the refresh rate or frequency from among several predefined values, permitting the selection of a single, optimum refresh rate applied to all memory cards. In another known system, a processor provides refresh signals in three groups, which reduces interference due to refresh operations since some memory cards are refreshed while others are available for memory access.

However, for information processing networks with multiple processors contending for a common bus to main storage, in which main storage is made up of multiple memory cards, a processor controlled refreshing of the memory arrays requires substantial time on the common bus, and thus degrades the performance of the network.

Therefore, it is an object of the present invention to provide an information processing network in which dynamic memory arrays are periodically refreshed with minimal interference between refresh cycles and external requests for access to the memory arrays.

Another object of the invention is to transfer some of the intelligence involved in array refresh operations from the processors to the memory cards of main storage.

A further object is to provide a network in which multiple memory cards of main storage can perform refresh operations independently of one another.

Yet another object is to provide a data processing network including means for individually selecting an optimum refresh frequency for each one of multiple memory cards.

SUMMARY OF THE INVENTION

To achieve these and other objects, there is provided an information processing network including a processing device configuration for manipulating bit-encoded data, and a memory having data arrays for storing bit-encoded data. The data arrays are dynamic and require periodic refresh cycles. The network further includes an interface connected to the processing configuration and to the memory, for transmitting bit-encoded data between the processing configuration and the memory. A timing signal means, independent of the processing device configuration, generates periodic timing pulses at a constant timing frequency. A refresh request means, in the memory, receives the timing pulses and generates periodic refresh request pulses responsive to the timing pulses. More particularly, refresh request pulses are generated at a frequency proportional to the timing frequency according to a selected value that determines the number of timing pulses required to generate each refresh request pulse. The refresh request means includes a means for controllably adjusting the value to change the proportion of refresh request pulses to timing pulses.

Preferably, the refresh request means includes a pulse counter receiving the timing pulses, a register, and a comparator circuit. The register provides a selected value, controllable by programming the register, to the comparator circuit as a first input, and the pulse counter provides a second input to the comparator. The comparator circuit thus generates one of the refresh request pulses every time it receives the number of timing signals equal to the selected value.

Optionally, a refresh pulse source independent of the timing signal can be connected to a multiplexer along with the output of the comparator circuit, for selecting one or the other of these signals to control the refresh requests.

When main storage includes multiple memory cards, each of the memory cards advantageously includes a pulse counter, register and comparator circuit, thus providing the means to individually optimize the refresh frequency. Each memory card further includes a buffering means for accumulating the refresh requests, delaying the provision of refresh pulses while the card is receiving and responding to an external access request. However, upon accumulating refresh requests equal to a predetermined threshold, these means inhibit a response to any further external access requests and provide at least one refresh pulse to the data arrays.

The buffering means of each memory card can include a refresh request counter. Each time it receives one of the refresh request pulses, the counter is incremented and generates a refresh request to control circuitry of the memory card. The counter also generates a refresh demand signal to the control circuitry when incremented to the threshold. Each time the control circuit provides a refresh pulse to the data arrays, the refresh request counter is decremented. In the absence of external access requests, refresh pulses will be generated until the refresh counter is decremented to zero.

A salient feature of the present invention is that processor overhead for controlling memory refresh operations, and interface traffic associated with such operations, are eliminated. This considerably reduces interference between refresh operations and processor operations on data. The refresh frequency is adjusted to its optimum value, not only in general, but individually for each memory card of main storage. Thus a main storage memory can operate at maximum efficiency, even though it may be comprised of different types of memory cards. Operations involving access to memory arrays are not interrupted for memory refresh unless the predetermined threshold is reached, and then only for a single refresh pulse. The threshold preferably is set sufficiently high so that it is rarely reached under normal operating conditions, thus further ensuring minimal interference by refresh operations.

IN THE DRAWINGS

For a further appreciation of the above and other objects and advantages, reference is made to the following detailed description and to the drawings, in which:

FIG. 1 is a schematic view of an information processing network in which multiple processing devices are associated through a shared interface with a main storage memory including multiple memory cards, and FIG. 2 is a schematic view of circuitry on one of the memory cards for controlling refresh pulses to the memory arrays in accordance with the present invention.

DETAILED DESCRIPTION OF THE PREFERRED EMBODIMENT

Figure 1:
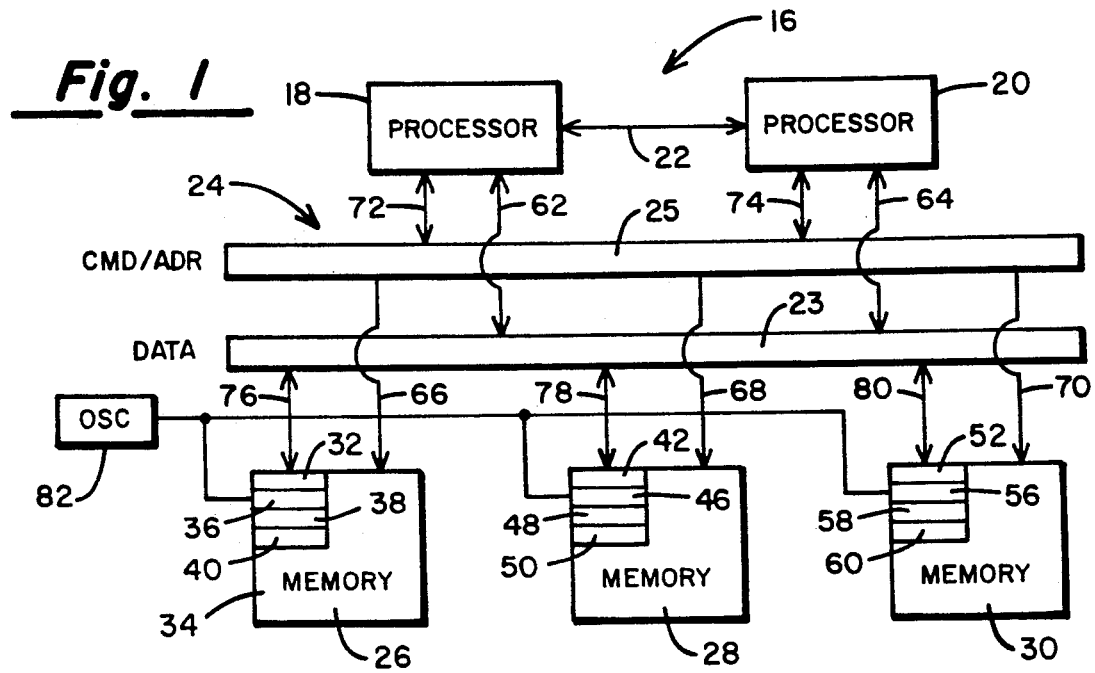

Turning now to the drawings, there is shown in FIG. 1 an information processing network 16 for storing and performing selected operations upon bit-encoded data. The system includes two processing devices, identified at 18 and 20. An arbitration link 22 joins the two processors, and is used in combination with arbitration logic residing in the processing devices to assign priority to either processor in terms of access to the interface. It is to be understood that the configuration of processing devices in this network could consist of a single processing device, or multiple processing devices in which multiple arbitration links are provided for a point-to-point connection of all processing devices.

An interface 24 connects the processing devices with main storage. Interface 24 can include a plurality of separate busses functioning in parallel, each shared in common by all of the processing devices and the memory cards of main storage. For example, working data (the information of most direct concern to users of the network) is transmitted over a working data bus 23, a command/address bus 25 transmits information controlling the transmissions of working data, including information as to the address in main storage at which working data is to be stored or retrieved. If desired, a communication bus (not shown) can transmit the status of working data as the working data is transmitted via the data bus.

Main storage includes multiple memory cards such as indicated at 26, 28 and 30. Memory card 28 for example, includes a data buffer 32, dynamic random access memory arrays 34 for storing bit-encoded data, a refresh request circuit 36, a refresh request buffer 38, and a control circuit 40 for governing access to the memory arrays.

Memory cards 28 and 30 are similar to memory card 26, respectively including a buffer 42, memory arrays 44, a refresh request circuit 46, a refresh request buffer 48 and a control circuit 50; and a data buffer 52, memory arrays 54, a refresh request circuit 56, a refresh request buffer 58 and a control circuit 60. These components are substantially identical to and function in the same manner as their counterparts in memory card 26. It is to be understood that main storage can comprise further, in fact multiple memory cards such as these.

Data lines 62 and 64 connect processing devices 18 and 20 to interface 24. Data lines 66, 68 and 70 connect the interface to memory cards 26, 68 and 70. Command lines 72 and 74, and further command lines 76, 78 and 80, connect interface 24 to the processing devices and memory cards, respectively. A clock oscillator 82 provides timing pulses to memory cards 26, 28 and 30, at a predetermined timing frequency.

Data buffer 32 of memory card 26 receives working information from the processors via the interface, for subsequent loading into memory arrays 34 or other handling. Refresh request circuit 36 receives the timing pulses and generates refresh request pulses at a frequency proportional to the timing frequency. Refresh request buffer 38 receives the refresh request pulses. In response to each request pulse, buffer 38 either stores the refresh request or causes control circuit 40 to provide a refresh pulse to the memory arrays, depending on whether control circuit 40 is involved in receiving or responding to an external request for access to the arrays, e.g. a request from one of the processing device to fetch or store data.

Figure 2:
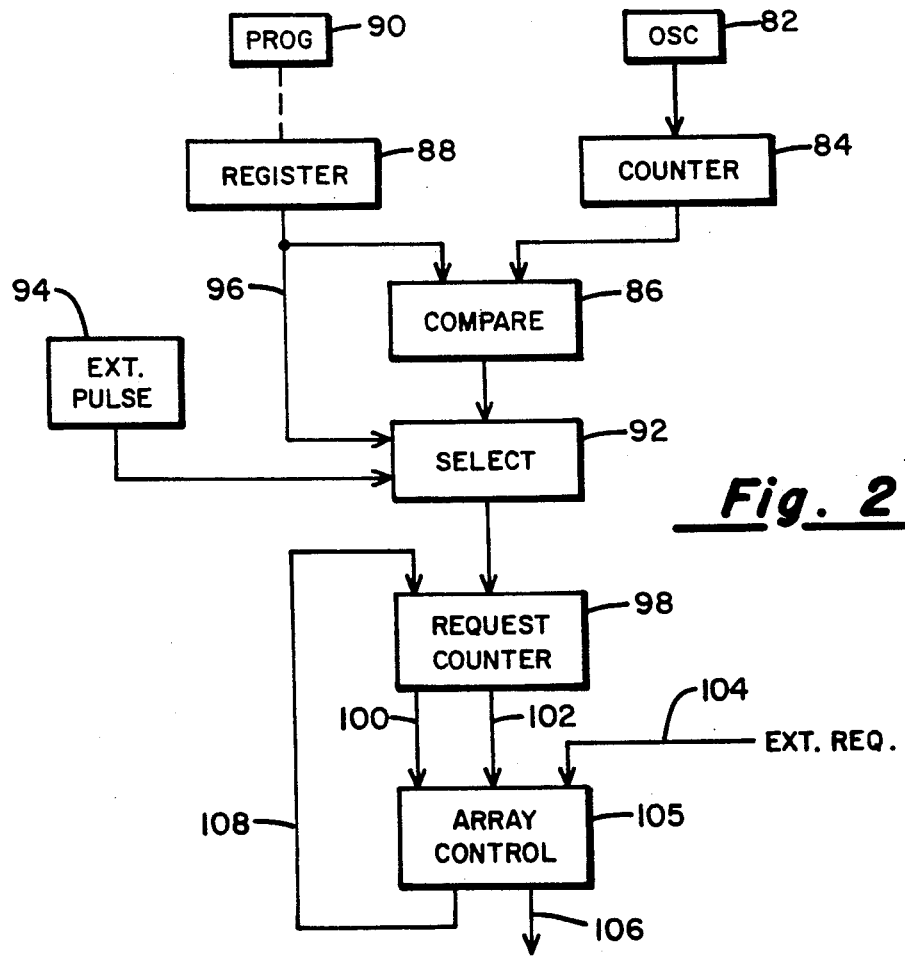

Memory arrays 34, 44 and 54 are dynamic random access memories (dynamic RAM) which, as noted previously, require a periodic refresh operation to maintain the integrity of data stored in the arrays. Refresh request circuit 36 and refresh request buffer 38, controlling the provision of refresh pulses to memory arrays 34, are shown in FIG. 2, it being understood that corresponding circuitry on memory cards 28 and 30 is substantially identical.

The refresh request control circuit includes a timing pulse counter 84 which receives the timing pulses from clock 82, and generates a counter output pulse each time it has received a predetermined number of timing pulses, e.g. 500. The counter output pulses are provided as one of the inputs to a comparator circuit 86.

The other input to comparator 86 is a refresh request value input, provided by a programmable refresh register 88. A programming device 90, external to memory card 26, is removably connectable to the memory card in order to program register 88, i.e. to adjust the refresh request value to a different setting. Device 90 is likewise connectable to the other memory cards, to enable individual adjustment of each of the memory cards to its optimal refresh request frequency. The output of comparator 86 is a refresh request pulse, generated each time the number of counter output pulses equals the refresh request value.

A multiplexer 92 receives the refresh request pulses and can direct them to refresh request buffer 38. Optionally, multiplexer 92 also receives refresh pulse from an external source 94, and can be set to provide either the external or the programmed refresh request pulses to the refresh request buffer. Ordinarily multiplexer 92 selects the programmed request pulses from comparator 86. However, when refresh register 88 provides a disabling input to the multiplexer over line 96, the multiplexer selects the input from external source 94 for forwarding to the refresh request buffer. The external source is used primarily to test the network.

Refresh request buffer 38 includes a request pulse counter 98 that receives the output of multiplexer 92, i.e. either the programmed or the external refresh request pulses. In response, the request counter is incremented and generates a refresh request 100, which is provided to control circuit 40 of the memory card. Request counter 98 provides another input to control circuit 40, namely a refresh demand 102, whenever the counter is incremented to a predetermined threshold value, e.g. eight. A third input to the control circuit, namely an external input 104, is active when the control circuit is providing access to the memory arrays for functions other than refresh, e.g. read/write functions.

Control circuit 40 responds to its inputs as follows. Upon receiving each refresh request from counter 98 (and if external input 104 is not active), the control circuit generates a refresh pulse to the memory arrays as indicated at 106. As it generates the refresh pulse, control circuit 40 also provides a "refresh taken" signal at 108 as an input to counter 98, which decrements the counter.

If the external input is active when control circuit 40 receives a refresh request pulse, it stores the request and does not provide a refresh pulse, nor does it generate the "request taken" signal. As long as external input 104 remains active, each succeeding refresh request is stored, and request counter 98 continues to increment.

Should counter 98 continue to increment until it reaches the threshold, however, the counter provides refresh demand 102 to the control circuit, which then interrupts the external operation associated with input 104 and causes control circuit 40 to provide a refresh pulse to the memory arrays, and to provide the decrementing signal to counter 98.

Thus, each of the memory cards is programmable to set the refresh request frequency with the relationship of refresh requests to refresh demands determined by the threshold value set in counter 98. Optimal values for refresh request frequency and refresh demand frequency will of course vary depending on the type of memory arrays involved. Generally, however, the refresh demand frequency must be sufficiently high (or conversely, the refresh demand cycle sufficiently brief) to ensure the integrity of data on the memory arrays. The threshold value in request counter 98 is set to determine the desired relationship between the refresh request frequency to the refresh demand frequency. A higher threshold requires more frequent refresh requests, but also substantially reduces the likelihood that counter 98, during normal operation of the network, will ever be incremented to the threshold value, thus reducing the probability that refresh pulses will interrupt other operations. In connection with the particular embodiment, a threshold of at least four has been found satisfactory.

Thus, in accordance with the present invention, each of a multiplicity of memory cards can be adjusted to its optimal refresh rate or frequency. This feature can substantially improve the efficiency of a main storage memory comprised of different types of memory cards, as the network need no longer functioned under a single refresh rate, which must meet the highest refresh rate requirement of any of the cards for use with all memory cards. The ability to commingle different memory technologies enhances versatility of the network. Another advantage, particularly for a network of multiple processing devices, is that the control of refresh pulses is transparent to the processors. Thus, processors no longer need to contend for control of a bus or other interface in order to provide refresh pulses, but rather can perform other operations on data while the memory cards themselves take care of refresh in response to a clock signal already provided for other uses in the network. Thus, processor overhead and demand for a shared interface, for memory refresh functions, are eliminated.

What is claimed is:

1. An information processing network including:
 a processing device configuration including a plurality of processing devices for manipulating bit-encoded data; a memory including a plurality of memory cards having data arrays for storing bit-encoded data, with the data arrays being dynamic and requiring periodic refresh cycles; an interface connected to and shared by the processing devices and the memory cards, for transmitting bit-encoded data between the processing configuration and the memory; and a timing signal means, independent of the processing devices and the memory cards, for generating timing pulses at a constant timing frequency;
 a refresh request means in each of the memory cards for receiving the timing pulses and for generating, responsive to the timing pulses, periodic refresh request pulses at a request frequency proportional to the timing frequency according to a selected value determining the number of timing pulses required to generate each refresh request pulse, each of said refresh request means including means for controllably adjusting the selected value to change the proportion of refresh request pulses to timing pulses; and
 wherein each of the memory cards further includes a buffering and control means for accumulating the refresh request pulses and delaying the generation of refresh pulses while the associated memory card is receiving and responding to an external access request and further, upon accumulating refresh request pulses equal to a predetermined threshold, inhibiting the associated memory card from responding to external access requests while providing at least one refresh pulse to the data arrays of the associated memory card, without gaining access to the interface and without inhibiting or otherwise interfering with operations of any of the processing devices.

2. The network of claim 1 wherein:

each of the refresh request means includes a timing pulse counter for receiving the timing pulses and generating a counter output pulse each time the number of timing pulses received accumulates to a predetermined number.

3. The network of claim 2 wherein:

each of the refresh request means further includes a register and a comparator circuit, said register providing the selected value as a first input to the comparator circuit and being programmable to controllably adjust the selected value, said pulse counter providing a second input to the comparator circuit, said comparator circuit generating one of the refresh request pulses, responsive to receiving counter output pulses equal to the selected value.

4. The network of claim 1 wherein:

each of the refresh request means includes a timing pulse counter incremented responsive to receiving each of the timing pulses, a register, and a comparator circuit receiving the selected value from the register as a first input and the output of the pulse counter as a second input, said comparator circuit generating one of the refresh request pulses each time the pulse counter output equals the selected value, the register being programmable to controllably adjust the selected value.

5. The network of claim 4 wherein:

the data arrays of a first one of the memory cards require a refresh pulse request cycle different from a corresponding request cycle of the data arrays in a second one of the memory cards, and the selected values associated with the first and second memory cards differ from one another, each said register being programmed according to the requirements of its associated data arrays.

6. The network of claim 1 wherein:

each of said buffering and control means includes a refresh request counter incremented and generating a refresh request each time it receives one of the refresh request pulses, and generating a refresh demand signal when incremented to the predetermined threshold, and a control circuit for receiving said refresh request, said refresh demand signal, and external access requests as inputs, and providing a refresh pulse to the data arrays responsive to receiving the refresh request and the absence of an external access request, and providing the refresh pulse responsive to receiving the refresh demand, said control circuit further providing a decrement input to the refresh request counter when providing one of the refresh pulses.

7. The network of claim 6 wherein:

the control circuit, responsive to receiving said refresh requests while sensing an external access request, stores the refresh requests, and provides refresh pulses responsive to stored refresh requests when no longer sensing an external request.

8. The network of claim 1 wherein:

said interface includes a data bus and a command/address bus.

9. A device for storing bit-encoded data, including:

a memory card including dynamic memory arrays for storing bit-encoded data, said memory arrays requiring periodic refresh pulses; frequency, and for generating as an output a refresh request signal including refresh request pulses at a refresh request frequency, the refresh request frequency being proportional to the timing frequency according to a selected number of timing pulses corresponding to each one of the refresh request pulses;

a means for controllably adjusting the selected number;

a refresh request pulse counter receiving and incremented by each of the refresh request pulses, for generating a first refresh output each time the request counter is incremented, and a second refresh output when the request counter is incremented to a predetermined threshold value greater than one; and a memory control circuit connected for receiving the first and second refresh outputs and an external access request, said control circuit generating a refresh pulse to the memory arrays responsive to receiving the first refresh output and to the absence of an external request, and for interrupting a response of the memory card to an external request and generating a refresh pulse to the arrays responsive to receiving the second refresh output.

10. The device of claim 9 wherein:

the memory card further includes a means for decrementing the refresh request counter each time the control circuit generates a refresh pulse.

11. The device of claim 10 wherein:

the memory control circuit accumulates refresh request pulses received during an external access request, and generates refresh pulses responsive to the stored refresh request pulses when the external request no long is sensed.

12. The device of claim 10 wherein:

said means for receiving a clocking signal includes a timing pulse counter incremented upon receiving each timing pulse, a register, and a comparator circuit receiving the output of the timing pulse counter and the selected value as an input from the register, said comparator circuit generating one of the refresh pulses each time the timing pulse counter provides its output to the comparator circuit the select number of times.

13. In a data processing system including a plurality of processing devices for manipulating bit-encoded data, a plurality of memory cards, each card including dynamic memory arrays for storing bit-encoded data, an interface connected to the processing devices and to the memory cards for transmitting bit-encoded data between the processing devices and the memory, and a clock oscillator for providing a timing signal including timing pulses at a predetermined timing frequency independent of the interface; a process for providing refresh pulses to the memory arrays of the memory cards, including the steps of:

generating a plurality of refresh request signals, one request signal corresponding to each of the memory cards, each refresh request signal including refresh request pulses with the cycle of the request pulses being an integral multiple value of the timing cycle of the timing pulses, each of the values being independently adjustable and selected to correspond with the associated memory arrays on the associated of said memory cards;

sensing for the presence of an external request for access to the memory arrays of each memory card;

generating a refresh pulse to the memory arrays of each memory card responsive to the generation of each of said request pulses and to sensing the absence of an external request; and alternatively delaying generation of the refresh pulses and storing each of the request pulses responsive to sensing an external request and then generating a refresh pulse responsive to each stored request pulse when the external request no longer is sensed.

14. The process of claim 13 including the further step of:
inhibiting any memory response to an external request and generating at least one refresh pulse, responsive to the accumulation of a predetermined threshold number of stored request pulses, said number being an integer greater than one.

* * * * *

UNITED STATES PATENT AND TRADEMARK OFFICE
CERTIFICATE OF CORRECTION

PATENT NO. : 5,193,165

DATED : March 9, 1993

INVENTOR(S) : Richard G. Eikill et al

It is certified that error appears in the above-identified patent and that said Letters Patent is hereby corrected as shown below:

In column 7, line 65, after "refresh pulses;" insert as the start of a second paragraph -- means on the memory card for receiving a clocking signal including timing pulses having a predetermined timing -- .

In column 8, line 62, after "associated" insert -- one -- .

Signed and Sealed this

Twenty-third Day of November, 1993

Attest:

BRUCE LEHMAN

Attesting Officer      Commissioner of Patents and Trademarks